US010002920B1

(12) United States Patent
Bolotnikov et al.

(10) Patent No.: US 10,002,920 B1
(45) Date of Patent: Jun. 19, 2018

(54) SYSTEM AND METHOD FOR EDGE TERMINATION OF SUPER-JUNCTION (SJ) DEVICES

(71) Applicant: General Electric Company, Schenectady, NY (US)

(72) Inventors: Alexander Viktorovich Bolotnikov, Niskayuna, NY (US); Reza Ghandi, Niskayuna, NY (US); David Alan Lilienfeld, Niskayuna, NY (US); Peter Almern Losee, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days. days.

(21) Appl. No.: 15/379,214

(22) Filed: Dec. 14, 2016

(51) Int. Cl.
*H01L 29/78* (2006.01)
*H01L 29/06* (2006.01)
*H01L 29/36* (2006.01)
*H01L 29/16* (2006.01)
*H01L 29/20* (2006.01)
(Continued)

(52) U.S. Cl.
CPC ........ *H01L 29/0634* (2013.01); *H01L 21/266* (2013.01); *H01L 21/26506* (2013.01); *H01L 29/1608* (2013.01); *H01L 29/2003* (2013.01); *H01L 29/36* (2013.01)

(58) Field of Classification Search
CPC ............. H01L 29/0634; H01L 29/7811; H01L 29/1095
USPC .......... 257/E21.418, E29.257, 341, E29.027, 257/E29.066; 438/268, 270
See application file for complete search history.

(56) References Cited

U.S. PATENT DOCUMENTS

| 6,037,632 | A | 3/2000 | Omura et al. |
| 7,224,022 | B2 * | 5/2007 | Tokano ............... H01L 29/0634 257/328 |
| 7,737,469 | B2 | 6/2010 | Saito et al. |

(Continued)

FOREIGN PATENT DOCUMENTS

WO 2013173414 A1 11/2013

OTHER PUBLICATIONS

Bai, Yuming, et al., Junction Termination Technique for Super Junction Devices, May 22-25, 2000, pp. 257-261.

(Continued)

*Primary Examiner* — Jonathan Han
(74) *Attorney, Agent, or Firm* — GE Global Patent Operation; John Darling

(57) ABSTRACT

The subject matter disclosed herein relates to super-junction (SJ) power devices and, more specifically, to edge termination techniques for SJ power devices. A semiconductor super-junction (SJ) device includes one or more epitaxial (epi) layers having a termination region disposed adjacent to an active region. The termination region includes a plurality of vertical pillars of a first and a second conductivity-type, wherein, moving outward from the active region, a respective width of each successive vertical pillar is the same or smaller. The termination region also includes a plurality of compensated regions having a low doping concentration disposed directly between a first side of each vertical pillar of the first conductivity-type and a first side of each vertical pillar of the second conductivity-type, wherein, moving outward from the active region, a respective width of each successive compensated region is the same or greater.

16 Claims, 9 Drawing Sheets

(51) Int. Cl.
   *H01L 21/265* (2006.01)
   *H01L 21/266* (2006.01)

(56) References Cited

U.S. PATENT DOCUMENTS

| | | | |
|---|---|---|---|
| 8,749,017 B2 * | 6/2014 | Lu | H01L 29/66348 257/378 |
| 8,772,868 B2 | 7/2014 | Yedinak et al. | |
| 8,866,221 B2 | 10/2014 | Hirler et al. | |
| 9,070,580 B2 | 6/2015 | Willmeroth et al. | |
| 9,281,392 B2 | 3/2016 | Weyers et al. | |
| 2004/0065921 A1 * | 4/2004 | Iwamoto | H01L 29/0634 257/341 |
| 2005/0139914 A1 * | 6/2005 | Blanchard | H01L 21/76208 257/341 |
| 2005/0184336 A1 * | 8/2005 | Takahashi | H01L 29/0634 257/328 |
| 2008/0185643 A1 * | 8/2008 | Hossain | H01L 29/0634 257/342 |
| 2008/0211053 A1 | 9/2008 | Lee et al. | |
| 2010/0059814 A1 | 3/2010 | Loechelt et al. | |
| 2013/0069158 A1 | 3/2013 | Ohta et al. | |
| 2014/0197477 A1 * | 7/2014 | Onishi | H01L 29/7811 257/329 |
| 2014/0231928 A1 | 8/2014 | Willmeroth et al. | |
| 2015/0115284 A1 | 4/2015 | Arthur et al. | |
| 2015/0115286 A1 | 4/2015 | Takeuchi et al. | |
| 2016/0087034 A1 | 3/2016 | You et al. | |

OTHER PUBLICATIONS

International Search Report and Written Opinion of the International Searching Authority in corresponding application PCT/US2017/057980, dated Jan. 19, 2018.

* cited by examiner

US 10,002,920 B1

SYSTEM AND METHOD FOR EDGE TERMINATION OF SUPER-JUNCTION (SJ) DEVICES

BACKGROUND

The subject matter disclosed herein relates to super-junction (SJ) power devices and, more specifically, to edge termination techniques for SJ power devices.

For semiconductor power devices, super-junction (SJ) (also referred to as vertical charge-balance) designs offer several advantages. For example, SJ devices demonstrate reduced on-resistance and reduced conduction losses relative to conventionally designed unipolar power devices. Additionally, SJ drift layers can be applied to a variety of power devices, such as metal-oxide-semiconductor field-effect transistors (MOSFETs), junction field effect transistors (JFETs), bipolar junction transistors (BJTs), diodes, as well as other devices that may be useful for medium-voltage (e.g., 2 kV-10 kV) and high-voltage (e.g., greater than or equal to 10 kV) power conversion related applications.

For high-voltage and/or high-current applications, devices fabricated using wide bandgap semiconductors (e.g., silicon carbide (SiC) and gallium nitride (GaN)) have a number of advantages in terms of temperature stability, reduced on-state resistance, and thinner device dimensions than corresponding silicon (Si) devices. Accordingly, wide bandgap semiconductor devices offer advantages to electrical conversion applications including, for example, power distribution systems (e.g., in electrical grids), power generation systems (e.g., in solar and wind converters), as well as consumer goods (e.g., electric vehicles, appliances, power supplies, etc.). However, there are also significantly higher electric fields present in wide bandgap semiconductors devices under reverse bias. As such, it is desirable to provide effective edge termination designs for wide bandgap semiconductor devices, such as SiC-SJ devices, to ensure reliable and robust device operation under reverse bias.

BRIEF DESCRIPTION

Certain embodiments commensurate in scope with the originally claimed subject matter are summarized below. These embodiments are not intended to limit the scope of the claimed invention, but rather these embodiments are intended only to provide a brief summary of possible forms of the invention. Indeed, the present disclosure may encompass a variety of forms that may be similar to or different from the embodiments set forth below.

In an embodiment, a semiconductor super-junction (SJ) device includes a substrate layer having a first conductivity-type and one or more epitaxial (epi) layers disposed on the substrate layer and including a termination region disposed adjacent to an active region. The active region includes vertical charge-balance pillars of the first conductivity-type, each having a first width, and vertical charge-balance pillars of a second conductivity-type, each having a second width. The termination region includes a plurality of vertical pillars of the first and second conductivity-type, wherein, moving outward from the active region, a respective width of each successive vertical pillar of the plurality of vertical pillars is the same or smaller. The termination region also includes a plurality of compensated regions having a low doping concentration disposed directly between a first side of each vertical pillar of the first conductivity-type and a first side of each vertical pillar of the second conductivity-type, wherein, moving outward from the active region, a respective width of each successive compensated region of the plurality of compensated regions is the same or greater.

In another embodiment, a method of manufacturing includes providing a semiconductor substrate layer having a first conductivity-type and forming a first epitaxial (epi) layer on the semiconductor substrate layer. The method includes applying a first mask that selectively exposes a first portion of both an active region and a termination region of the first epi layer and implanting dopant of the first conductivity-type with a first implantation dose into the first portion of both the active region and termination region of the first epi layer. The method includes applying a second mask that selectively exposes a second portion both the active region and the termination region of the first epi layer and implanting dopant of a second conductivity-type with a second dose into the second portion of both the active region and termination region of the first epi layer. The first portion and the second portion overlap in the termination region to form a plurality of compensated regions disposed directly in between a plurality of vertical pillars of the first conductivity-type and a plurality of vertical pillars of the second conductivity-type in the termination region of the first epi layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
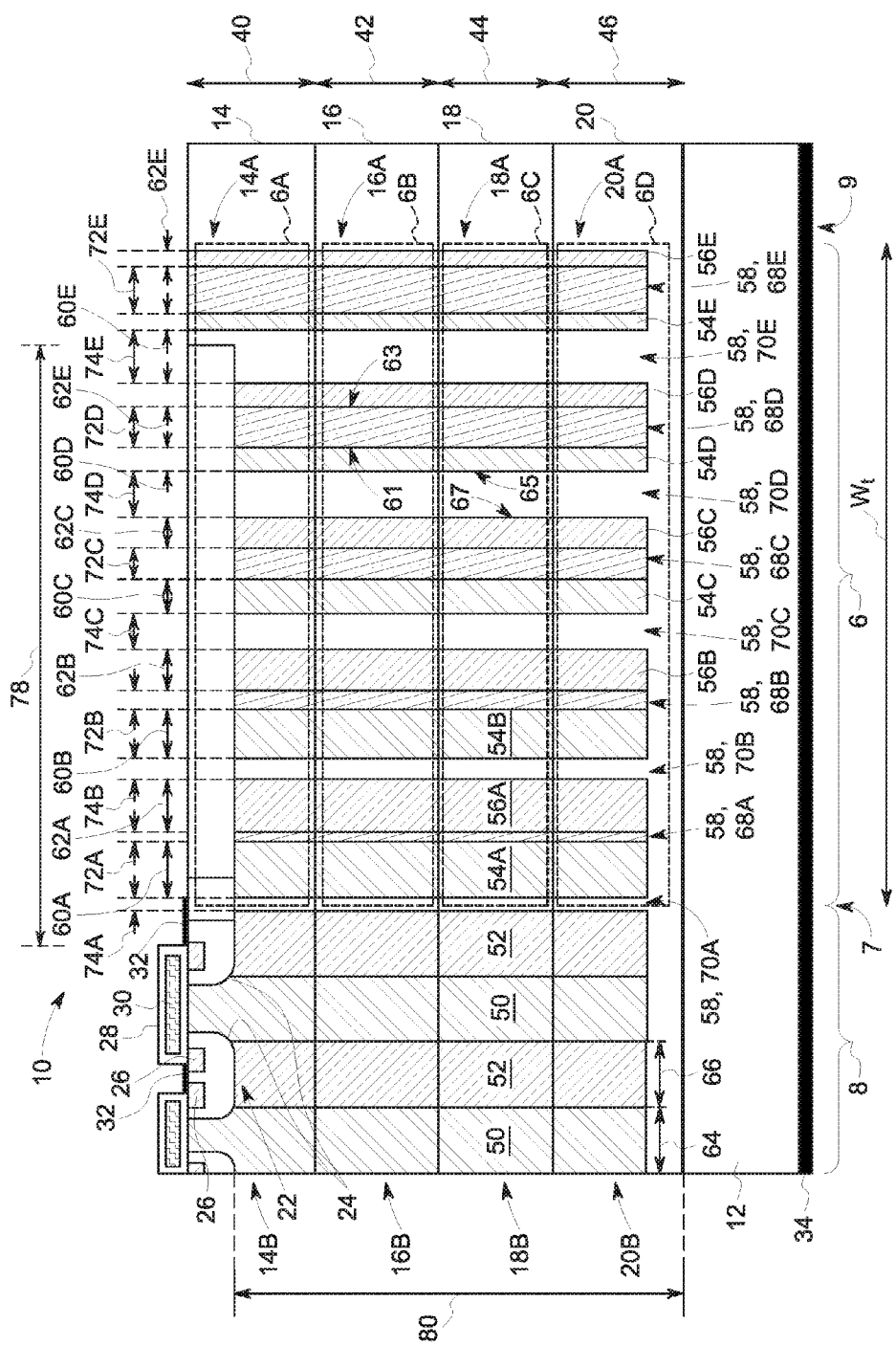
FIG. 1 is a schematic illustrating a cross-sectional view of a portion of a multi-layer silicon carbide super-junction (SiC-SJ) MOSFET device having a termination region with vertical pillars of a first and a second conductivity-type that decrease in width with increasing distance from the active area and that are separated by regions of low doping concentration (e.g., compensated regions) that increase in width with increasing distance from the active area, in accordance with embodiments of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "about" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. The term "adjacent" as used herein means that two features are disposed contiguously and are in direct (e.g., immediate) contact with each other. As used herein, the term "disposed on" refers to layers disposed directly (e.g., immediately) in contact with each other or indirectly by having intervening layers there between, unless otherwise specifically indicated. Further, the term "on" describes the relative position of the layers/devices to each other and does not necessarily mean "on top of" since the relative position above or below depends upon the orientation of the device to the viewer. Moreover, the use of "top," "bottom," "above," "below," "upper", "buried" and variations of these terms is made for convenience, and does not require any particular orientation of the components unless otherwise stated. With this in mind, as used herein, the terms "lower," "buried," "middle," or "bottom" refer to a feature (e.g., epitaxial (epi) layer, termination region) that is relatively nearer the substrate layer, while the terms "top" or "upper" refer to the particular feature (e.g., epi layer, termination region) that is relatively the farthest from the substrate layer.

Present embodiments are directed toward designs and methods for manufacturing super-junction (SJ) devices, also referred to as vertical charge-balance devices. The present approach is applicable to both traditional semiconductors (e.g., silicon), as well as wide bandgap semiconductors (e.g., SiC, GaN, aluminum nitride (AlN), boron nitride (BN)). The disclosed designs and methods are useful in the manufacture of SJ devices, such as super-junction metal-oxide-semiconductor field-effect transistors (SJ-MOSFETs), super-junction junction field effect transistors (SJ-JFETs), super-junction bipolar junction transistors (SJ-BJTs), super-junction diodes, as well as other SJ devices that may be useful for medium-voltage (e.g., 2 kV-10 kV) and high-voltage (e.g., greater than or equal to 10 kV) power conversion related applications. As discussed below, the disclosed SJ device designs include multi-layered termination regions implemented using repeated epitaxial growth and dopant implantation steps. As used herein, the term "multi-layered," as well as references to a particular number of layers, for example, "two-layered," "three-layered," "four-layered," refer to the number of epitaxial SiC layers, also referred to herein as epi layers.

More specifically, present embodiments are directed toward edge termination designs for SJ devices that provide a blocking voltage that is close to device entitlement. For present embodiments, the SJ device includes one or more epitaxial semiconductor layers (e.g., SJ drift layers) having a first conductivity-type (e.g., n-type) and having a termination region disposed adjacent to an active region. Both the active region and the termination region include vertical pillars of the first conductivity-type (e.g., n-type) and a second conductivity-type (e.g., p-type). The vertical pillars in the active region are vertical charge-balance pillars designed to conduct current in on-state operation and block current flow in off-state operation, while the vertical pillars in the termination region suppress electric field peak near the edge of the active region to provide effective edge termination. As discussed below, the vertical pillars in the termination region that are farther from the active region generally have smaller widths. Further, vertical pillars in the termination region are generally separated by regions of low doping of the first or second conductivity-type (e.g., compensated regions and/or epi-doped regions), wherein the regions of low doping that are farther from the active region have larger widths. As discussed below, the disclosed edge termination technique enables the simultaneous implantation of the active and termination regions of each epi layer of the SJ structure, limiting the number of process steps. Additionally, the disclosed termination design enables the manufacture of SJ devices in which the implanted vertical change-balance pillars of the active area are defined with dimensions that approach the smallest achievable by current process/technology (e.g., a minimum feature width), enabling better device performance compared to devices utilizing other edge termination approaches. The disclosed termination designs are also relatively robust to process variations (e.g., dopant concentration in the implanted regions, dopant concentration in the epitaxial layers, mask alignment issues, etc.) while still providing effective edge termination.

With the foregoing in mind, FIG. 1 is a schematic illustrating a cross-sectional view of a termination region 6 and an active region 8 for an embodiment of a SJ device 10 (i.e., SJ-MOSFET device 10), in accordance with embodiments of the present approach. The SJ device 10 is discussed below in the particular context of a SiC-SJ device 10; however, in other embodiments, other wide bandgap semiconductors (e.g., GaN, AlN, BN) may be used, in accordance with the present disclosure. The termination region 6 of the SiC-SJ device 10 has a width (Wt) that extends from the boundary 7 (i.e., where the active region 8 and the termination region 6 meet) to an outer end 9 of the termination region 6. As discussed below, the illustrated SiC-SJ device 10 has a SiC substrate layer 12 and four of SiC epitaxial (epi) layers, including a top epi layer (also referred to herein as the device layer 14, disposed farthest from the SiC substrate 12), and three lower (buried) SiC epi layers 16, 18, and 20, disposed between the device layer 14 and the SiC substrate layer 12. It should be noted that layers and regions may be described herein as being of a first or a second conductivity-type, in which the first conductivity-type may be either n-type or p-type, and the second conductivity-type is the opposite conductivity-type (i.e., p-type when the first conductivity-type is n-type, n-type when the first conductivity-type is p-type). With this in mind, the substrate layer 12 is of the first conductivity-type.

The device layer 14 of the illustrated SiC-SJ device 10 includes features corresponding to a SJ-MOSFET device 10. In other embodiments, the device layer 14 may include or support features corresponding to a SJ-JFET, a SJ-BJT, a SJ diode, or another suitable SJ device. The device layer 14 of the illustrated SiC-SJ device 10 has a doping of the first or second conductivity-type and includes a SJ drift region 22. The device layer 14 includes well regions 24 of opposite conductivity-type relative to the device layer 14 disposed adjacent to the SJ drift region 22, as well as source regions 26 of the same conductivity-type as the device layer 14 disposed adjacent to the well regions 24. A dielectric 28 (e.g., silicon dioxide) separates a gate electrode 30 from the underlying well regions 24 and source regions 26. Source/body contacts 32 are disposed on top of the device layer 30, adjacent to the source regions 26, and a drain contact 34 is disposed adjacent to a surface of the SiC substrate 12. It may be appreciated that certain commonly understood design elements (e.g., top metallization, passivation, and so forth) are omitted for the illustrated SiC-SJ device 10.

As mentioned, the illustrated SiC-SJ device 10 includes four epitaxial SiC layer: 14, 16, 18, and 20. Portions of the epi layers in the termination region 6 of the device 10 are referred to herein as the termination regions 14A, 16A, 18A, and 20A of SiC layers 14, 16, 18, and 20, respectively. Additionally or alternatively, the termination region 6 of the SiC-SJ device 10 may be described herein as having or including the termination region 6A of the epi layer 14, the termination region 6B of the epi layer 16, the termination region 6C of the epi layer 18, and the termination region 6D of the epi layer 20. Portions of these epi layers disposed in the active region 8 of the device 10 are referred to herein as the active regions 14B, 16B, 18B, and 20B of the epi layers 14, 16, 18, and 20, respectively. In other embodiments, the SiC-SJ device 10 may include any suitable number of epi layers, for example, 1, 2, 3, 4, 5, 6 or more; each including respective active and termination regions to provide desirable blocking capability. In example embodiments, the blocking capability, based on the number of epi layers, is in the range of about 600 V to about 10 kV. For the SiC-SJ device 10 illustrated in FIG. 1, epi layer 14 has a thickness 40, epi layer 16 has a thickness 42, epi layer 18 has a thickness 44, and epi layer 20 has a thickness 46, which are discussed in greater detail below. In general, each of the thicknesses 40, 42, 44, and 46 may be independent values ranging from approximately 4 µm to approximately 12 µm.

Each of the epi layers 14, 16, 18, and 20 of the illustrated SiC-SJ device 10 has a specific doping concentration (e.g., an epi doping concentration), and the doping concentration of these epi layers may be the same, in certain embodiments, or may be different, in other embodiments. For the illustrated SiC-SJ device 10, epi layers 14, 16, 18, and 20 include continuous, vertical charge-balance pillars of the first conductivity-type 50 and continuous, vertical charge-balance pillars of the second conductivity-type 52, which are implanted regions of the first and the second dopant type that define the electric field distribution in the active region 8 of the SiC-SJ power device 10. Additionally, the termination sub-regions 6A, 6B, 6C, and 6D include continuous, vertical pillars of the first conductivity-type 54 (e.g., vertical pillars 54A, 54B, 54C, 54D, 54E) and continuous vertical pillars of the second conductivity-type 56 (e.g., vertical pillars 56A, 56B, 56C, 56D, 56E) that are separated by low-doped regions 58. For present embodiments, these vertical pillars 54 and 56 and the low-doped regions 58 are suitably sized and arranged such that the effective doping profile in the termination 6 generally decreases with increasing distance from the boundary 7 (i.e., moving outward from the active region 8). As such, the disclosed termination design gradually reduces the strength of the electric field outside of the active region 8 of the SiC-SJ device 10 under high-voltage blocking operation. That is, when the embodiment of the SiC-SJ device 10 illustrated in FIG. 1 is in an off-state under reverse bias, vertical pillars 54 and 56 deplete to provide ionized dopants (immobile charges) that, when suitably arranged, allow the electric field to be reshaped within periphery of active region 8 (i.e., within the termination region 6). When vertical pillars 54 and 56 deplete under reverse bias, they prevent electric field peaks and provide electric field distributions with a magnitude that gradually decreases with increasing distance from the active region 8 of the SiC-SJ device 10.

For the illustrated SiC-SJ device 10 of FIG. 1, the vertical pillars of the first conductivity-type 54 (e.g., vertical pillars 54A, 54B, 54C, 54D, 54E) in the termination region 6 have widths 60 (e.g., width 60A, 60B, 60C, 60D, 60E) that are all smaller than the width 64 of the vertical charge-balance pillars of the first conductivity-type 50 in the active region 8, and that continue to successively decrease with increasing distance from the boundary 7 (e.g., 60A>60B>60C>60D>60E). Similarly, for the illustrated SiC-SJ device 10, the vertical pillars of the second conductivity-type 56 (e.g., vertical pillars 56A, 56B, 56C, 56D, 56E) in the termination region 6 have widths 62 (e.g., width 62A, 62B, 62C, 62D, 62E) that are all smaller than the width 66 of the vertical charge-balance pillars of the second conductivity-type 52 in the active region 8, and that successively continue to decrease with increasing distance from the boundary 7 (e.g., 62A>62B>62C>62D>62E).

For the illustrated embodiment, the low-doped regions 58 include compensated regions 68 (e.g., compensated regions 68A, 68B, 68C, 68D, 68E) and epi-doped regions 70 (e.g., epi-doped regions 70A, 70B, 70C, 70D, 70E). As used herein, the term "compensated regions" refers to regions of an epi layer that are implanted using two different implantations, $N_a$ and $N_b$, of opposite conductivity-types, and, as such, compensated regions 68 have a net doping concentration of: $N_a - N_b$, plus or minus the doping concentration of the epi layer ($N_{epi}$). For example, when the epi layer has the first conductivity-type (e.g., same as the first implantation), then the compensated regions 68 have a net doping concentration of: $N_a - N_b + N_{epi}$. When the epi layer has the second conductivity-type (e.g., same as the second implantation), then the compensated regions 68 have a net doping concentration of $N_a - N_b - N_{epi}$. In other words, the net doping concentration may be determined as the sum ($\Sigma$) of the dose of each doping process (i.e., $N_a$, $N_b$, and $N_{epi}$), wherein doses of the first conductivity-type and the second conductivity-type are afforded opposite (i.e., positive, negative) signs. The compensated regions 68, for example compensated region 68D, may be described herein as being disposed directly between a first side 61 of the vertical pillar of the first conductivity-type 54D and a first side 63 of the vertical pillar of the second conductivity-type 56D. Similarly, the epi-doped regions 70, for example epi-doped region 70D, may be described herein as being disposed between a second side 65 the vertical pillar of the first conductivity-type 54D and a second side 67 of the vertical pillar of the second-conductivity-type 56C.

In certain embodiments, low-doped regions 58 may have a doping concentration that is at least approximately 80% lower than the doping concentration of the vertical pillars of the first conductivity-type 54 or the vertical pillars of the second conductivity-type 56. In certain embodiments, at least a portion of these low-doped regions 58 have a doping concentration that is close to (e.g., within about 20%) or substantially the same as the epi doping of the SiC layers 14, 16, 18, or 20. Additionally, for the illustrated SiC-SJ device 10, the low-doped regions 58 generally have widths that are larger with increasing distance from the boundary 7. In particular, for the illustrated embodiment, compensated regions 68 (e.g., compensated regions 68A, 68B, 68C, 68D, 68E) have widths 72 (e.g., width 72A, 72B, 72C, 72D, 72E) that increase with increasing distance from the boundary 7 (e.g., 72A<72B<72C<72D<72E). In other embodiments, the compensated regions 68 (e.g., compensated regions 68A, 68B, 68C, 68D, 68E) have widths 72 (e.g., width 72A, 72B, 72C, 72D, 72E) that remain substantially constant or increase with increasing distance from the boundary 7 (e.g., 72A≤72B≤72C≤72D≤72E). Additionally, for the illustrated embodiment, the epi-doped regions 70 (e.g., epi-doped regions 70A, 70B, 70C, 70D, 70E) have widths 74 (e.g., width 74A, 74B, 74C, 74D, 74E) that increase with increasing distance from the boundary 7 (e.g., 74A<74B<74C<74D<74E).

Additionally, the termination region 14A of the device layer 14 includes a planar junction termination extension (JTE) 76 disposed adjacent to the well regions 24. In certain embodiments, the JTE 76 may be implemented as a continuous layer of the second conductivity-type, as illustrated in FIG. 1. In certain embodiments, the JTE 76 may be a multizone or graded JTE, as disclosed in U.S. Pat. No. 9,406,762, which is incorporated by reference in its entirety for all purposes. For example, in certain embodiments, the JTE 76 may be implemented as a number of implanted blocks or bricks of implanted doping of the second conductivity-type such that the effective doping profile of the second conductivity-type generally decreases with increasing distance from the boundary 7. By further example, in certain embodiments, the JTE 76 may have a width 78 (i.e., $W_{JTE}$ 78) that is less than or equal to the termination width 6 of the SiC-SJ device 10.

For the embodiment of the SiC-SJ device 10 illustrated in FIG. 1, the vertical pillars 50, 52, 54, 56, and 68 extend through a substantial portion of the epi layers 14, 16, 18, and 20 to form substantially continuous vertical structures. As illustrated, the vertical pillars 50, 52, 54, 56, and 68 do not generally extend all the way through the thickness 46 of the epi layer 20, stopping short of reaching the SiC substrate 12. As such, it may be noted that, for the illustrated embodiment, the epi layers 14, 16, 18, and 20 should be of the first conductivity-type (i.e., same conductivity-type as the substrate 12) and a portion of the epi layer 20 through which the vertical pillars 50, 52, 54, 56, and 68 do not extend may be higher doped to minimize resistance of the epi layer 20. For embodiments in which the vertical pillars 50, 52, 54, 56, and 68 extend all the way through the thickness 46 of the epi layer 20 to reach the substrate 12, the epi layers 14, 16, 18 may be of either the first or the second conductivity-type (i.e., same or opposite conductivity-type relative to the substrate 12).

Additionally, as illustrated, in certain embodiments, device features (e.g., well region 26, source region 26, JTE 76) may occupy a portion of the device layer 30, and, therefore, in some embodiments the illustrated vertical pillars 50, 52, 54, 56, and 68 may not extend all the way through the thickness 40 of the epi layer 14. However, in other embodiments, the illustrated vertical pillars 50, 52, 54, and 56 extend all the way through the thicknesses 42 and 44 of the epi layers 16 and 18.

Figure 2:
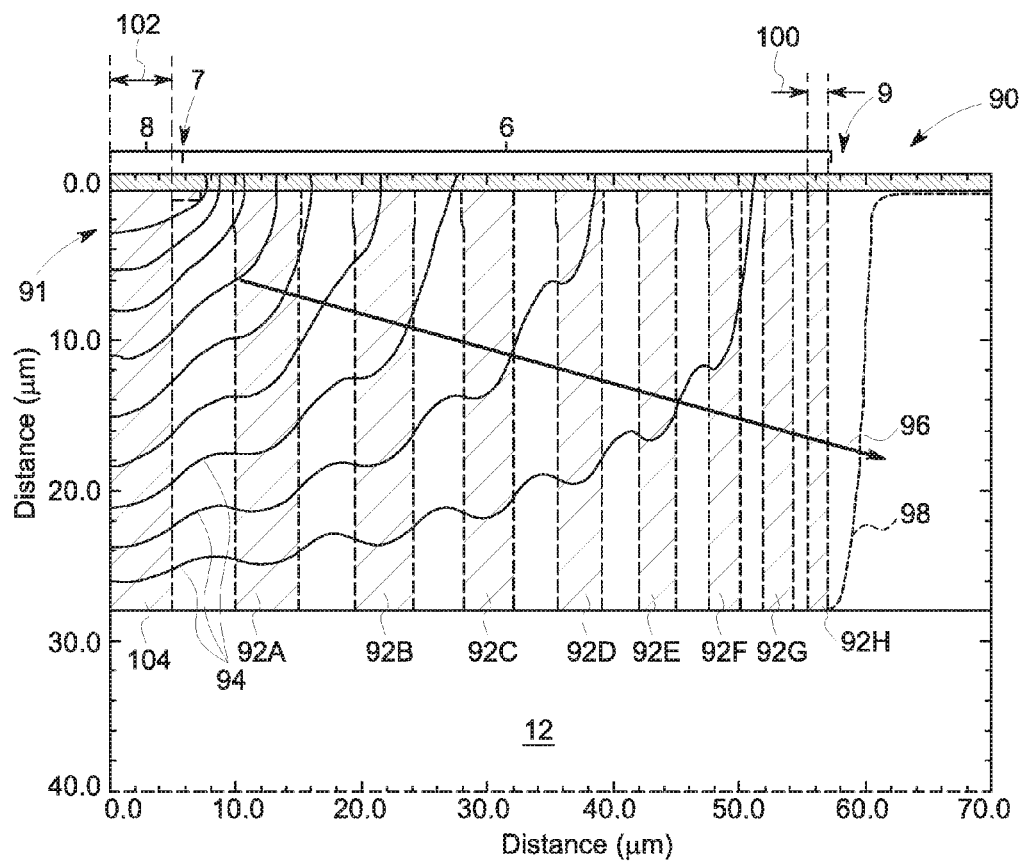
FIG. 2 is a schematic illustrating a termination region for a SiC-SJ device having an epitaxial (epi) layer of a first conductivity-type and implanted vertical pillars of a second conductivity-type that decrease in width with increasing distance from a boundary between an active region and the termination regions, including equipotential lines demonstrating the electric field present under reverse bias conditions.

FIG. 2 illustrates a cross-sectional view of a SiC-SJ device 90 having a termination region 6 that includes an epi layer 91 of the first conductivity-type having continuous, vertical pillars 92 (e.g., vertical pillars 92A, 92B, 92C, 92D, 92E, 92F, 92G, 92H) having the second conductivity-type that extend through the epi layer 91 in the termination region 6. However, the termination 6 of the SiC-SJ device 90 lacks the compensated regions 68 of the present approach. FIG. 2 includes equal potential lines 94 that represent the electric field present in the termination region 6 of the SiC-SJ device 90 under reverse bias conditions. The continuous, vertical pillars 92 in the termination region 6 of the illustrated SiC-SJ device 90 enable effective reshaping of electric field outward from the active region 8 of the device. As indicated by the arrow 96, the strength of the electric field generally decreases with increasing distance from the active region 8 until the strength of the field is sufficiently decreased, as illustrated by the dashed line 98. Accordingly, the vertical pillars 92 of the second-conductivity-type demonstrate effective edge termination for the SiC-SJ device 90 of FIG. 2.

It should be noted that, since the SiC-SJ device 90 of FIG. 2 lacks the compensated regions 68 of the present approach, the vertical pillar 90E that is farthest from the boundary 7 may have a width 100 that is defined using a minimum feature width (i.e., the smallest width achievable based on current process/technology). As illustrated in FIG. 2, the width 102 of the charge-balance pillars 104 in the active region 8 is generally greater than the widths of the vertical pillars 92 in the termination region 6 to achieve the desired effective doping profile. As such, this causes the width 102 of the charge-balance pillars 104 to be greater than the minimum feature width, undesirably increasing the cell pitch size and thus degrading the potential performance of the SiC-SJ device 90. In contrast, as illustrated in FIG. 1 and discussed above, the SiC-SJ device 10 of the present approach includes the compensated regions 68 that resulted from overlap of two implanted regions of opposite type of conductivity, that enable the fabrication of vertical pillars 54 and 56 having widths 60 and 62 below the minimum feature width. As such, the widths 64 and/or 66 of the charge-balance pillars 50 and 52 in the active region 8 of the SiC-SJ device 10 of FIG. 1 may be defined by the minimum feature width, resulting in a device having a smaller cell pitch size than that of the SiC-SJ device 90.

Figure 3:
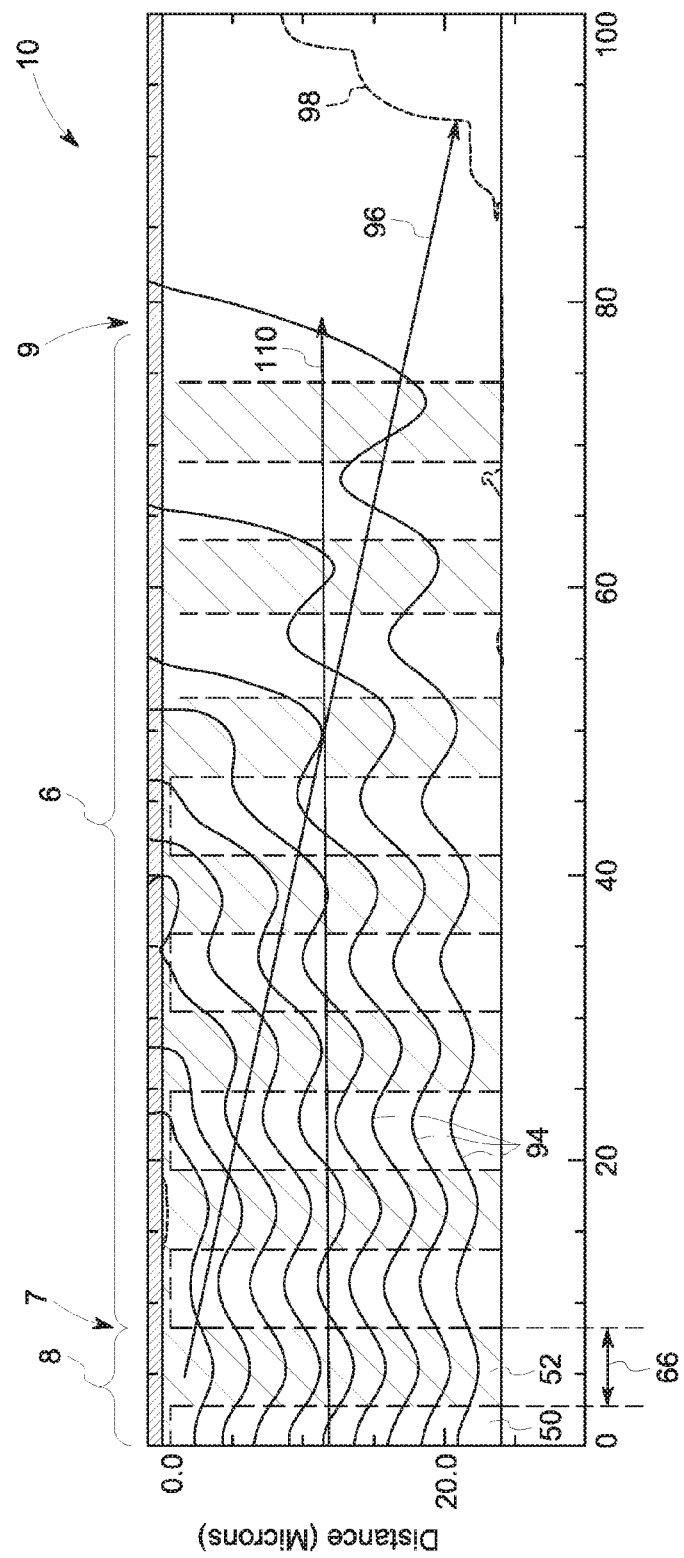
FIG. 3 is a schematic illustrating the termination region for an embodiment of a SiC-SJ device of the present approach, including equipotential lines demonstrating the electric field present under reverse bias conditions.
Figure 4:
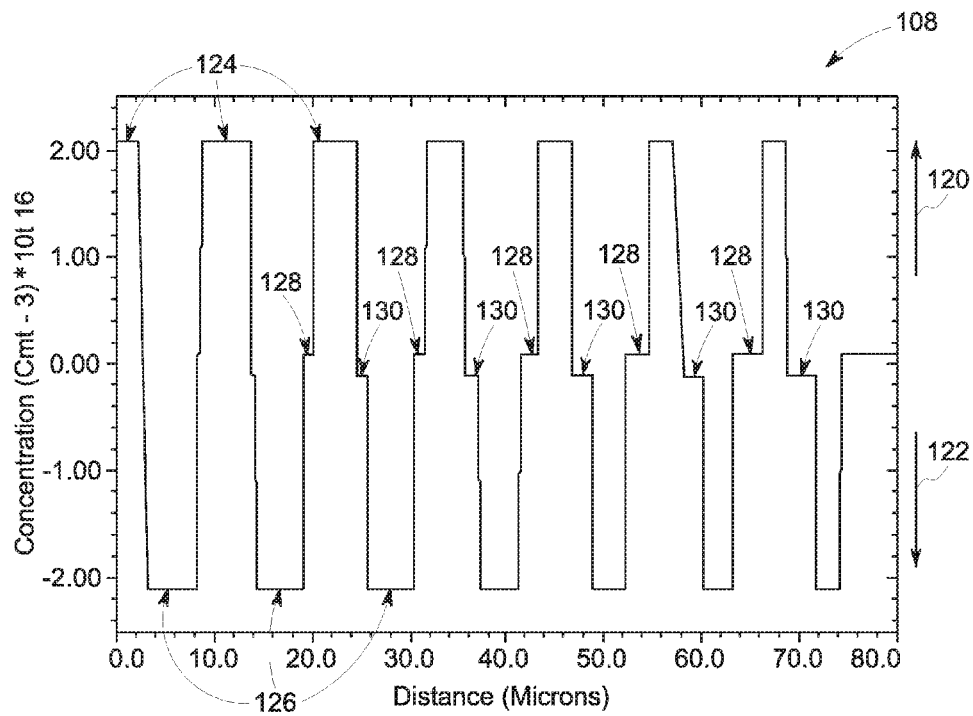
FIG. 4 is a graph illustrating doping concentration as a function of distance along the line 110 for the SiC-SJ device of FIG. 3, in accordance with embodiments of the present approach.

FIG. 3 illustrates a cross-sectional schematic view of the embodiment of a SiC-SJ device 10 of FIG. 1, in which regions are generally shaded in a binary fashion according to their general (e.g., n or p) dopant type. FIG. 4 is a graph 108 illustrating doping concentration as a function of distance along the line 110 for the SiC-SJ device of FIG. 3. Like FIG. 2, FIG. 3 includes equal potential lines 94 that represent the electric field present in the termination region 6 of the SiC-SJ device 10 under reverse bias conditions. Again, as indicated by the arrow 96, the strength of the electric field generally decreases with increasing distance from the active region 8 until the strength of the field is sufficiently decreased, as illustrated by the dashed line 98. Accordingly, the termination region 6 of the SiC-SJ device 10 illustrated in FIG. 3 also provides effective edge termination. However, unlike the SiC-SJ device 90 illustrated in FIG. 2, the width of the charge-balance pillars (e.g., width 66) in the active region 8 can be defined using the minimum feature width of the applied processor/technology when fabricating the SiC-SJ device 10 of FIG. 3, resulting in a smaller cell pitch size of device and subsequently increased device density.

The binary shading of FIG. 3 does not distinguish between the different doping concentrations of the regions of the same conductivity-type. However, the graph 108 of FIG. 4 provides greater insight, in which the positive direction 120 on the y-axis corresponds to doping of the first conductivity-type and the negative direction 122 corresponds to doping of the second conductivity-type.

Accordingly, the vertical pillars of the first conductivity-type (i.e., vertical charge-balance pillars 50 and vertical pillars 54, as illustrated in FIG. 1) and the vertical pillars of the second conductivity-type (i.e., vertical charge-balance pillars 52 and vertical pillars 56, as illustrated in FIG. 1) are indicated by the highest relative doping concentrations of the first 124 and second 126 conductivity-type, respectively, in FIG. 4. For the illustrated embodiment, the shoulders 128 correspond to the epi-doped regions 70 between the interdigitated vertical pillars of the first conductivity-type 54 and the vertical pillars of the second conductivity-type 56 in the termination region 6, and therefore, corresponds to the doping of the SiC epitaxial layers (e.g., epi layers 14, 16, 18, or 20 illustrated in FIG. 1). Additionally, the shoulders 130 correspond to the compensated regions 68 that are disposed between vertical pillars 54 and 56 in the termination region 6, as best illustrated in FIG. 1. As such, for certain embodiments, the compensated regions 68 have a net doping concentration that is significantly lower than the doping concentration of the vertical pillars of the first conductivity-type 126 and/or the doping concentration of the vertical pillars of the second conductivity-type 124. In other embodiments, the implantation dose of the implants/regions of the first conductivity-type and the implantation dose of the implants/regions of the second conductivity-type may be substantially equal, effectively canceling (compensating) one another in the regions of the epi layers that receive both implants (e.g., the overlap), resulting in compensated regions 68 having doping concentration that is significantly lower than the doping concentration of the vertical pillars of the first conductivity-type 126 and/or the doping concentration of the vertical pillars of the second conductivity-type 124.

FIGS. 5A-E illustrate cross-sectional views of an embodiment of the SiC-SJ device 10 of FIG. 1 at various stages during an example method of fabrication, including the termination region formation. The example fabrication begins with the structure illustrated in FIG. 5A, in which epi layer 20 has been formed on top of the SiC substrate layer 12, for example, using chemical vapor deposition (CVD). In certain embodiments, the epi layer 20 may be doped as it is formed (e.g., epi doped).

Figure 5A:
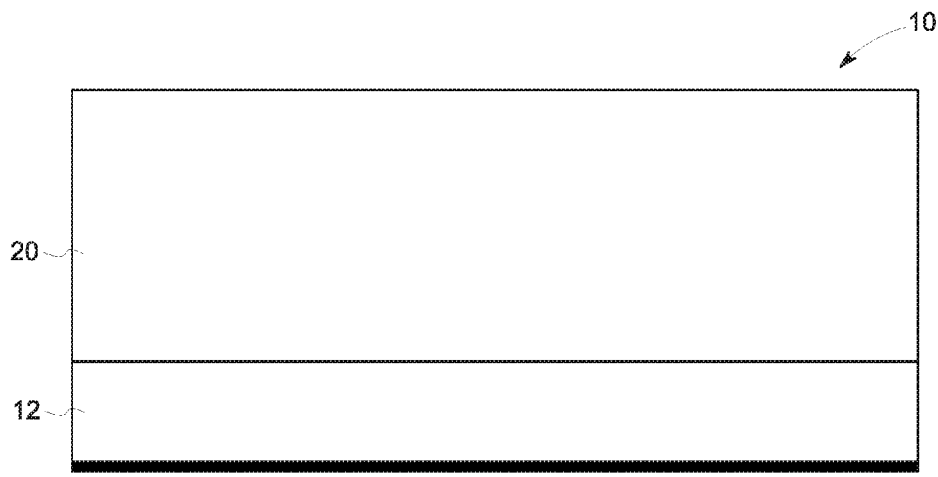
FIGS. 5A-5E are schematics illustrating several steps related to the fabrication of an embodiment of the SiC-SJ device of FIG. 1.
Figure 5B:
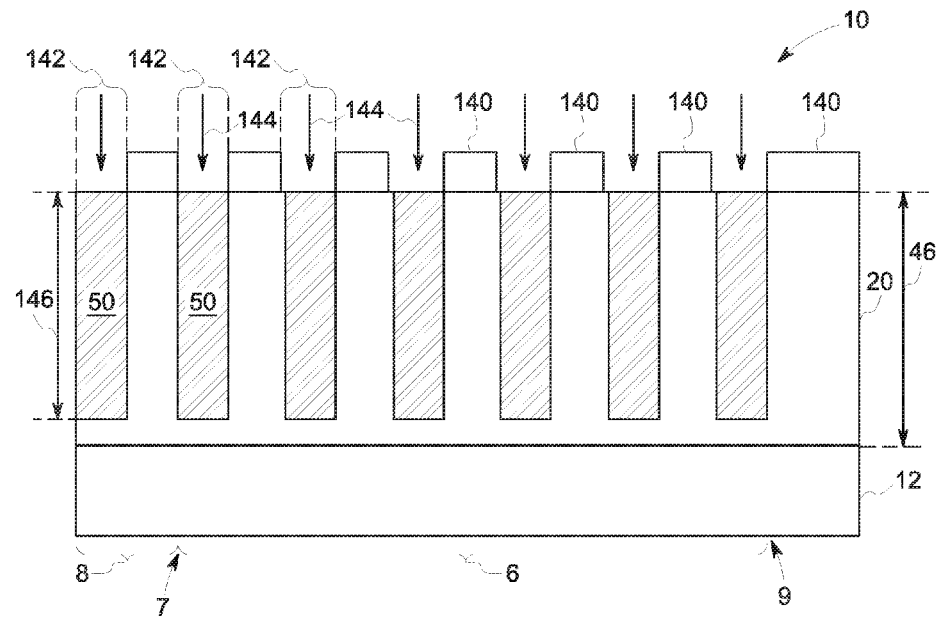

Subsequently, as illustrated in FIG. 5B, the newly formed epi layer 20 is masked with a suitable photolithographic mask 140 for high-energy (e.g., between approximately 380 kiloelectron volts (keV) and approximately 40 megaelectron volts (MeV)) implantation. For example, in certain embodiments, such masking materials may include: silicon on insulator (SOI), polysilicon, high-Z (atomic number) metals (e.g., platinum, molybdenum, gold, etc.), insulators (e.g., thick silicon oxide), photoresist, organic materials (e.g., polyimide), or combinations thereof. The mask 140 is applied such that a first portion 142 of the epi layer 24 is exposed, and a first high-energy implantation (represented by the arrows 144) is performed to implant dopant of the first conductivity-type into both the active region 8 and the termination region 6 of the epi layer 24. In certain embodiments, the penetration depth 146 of the implantation may be between approximately 4 μm and approximately 12 μm. As illustrated and mentioned above, the implantation may not extend all the way through the thickness 46 the bottom epi layer 20 (i.e., nearest the SiC substrate 12) to reach the SiC substrate 12; however, for other epi layers (e.g., epi layer 16, epi layer 18, as illustrated in FIG. 1), the implantation may extend through the entire thickness (e.g., thickness 42 and 44) of the epi layers.

Figure 5C:
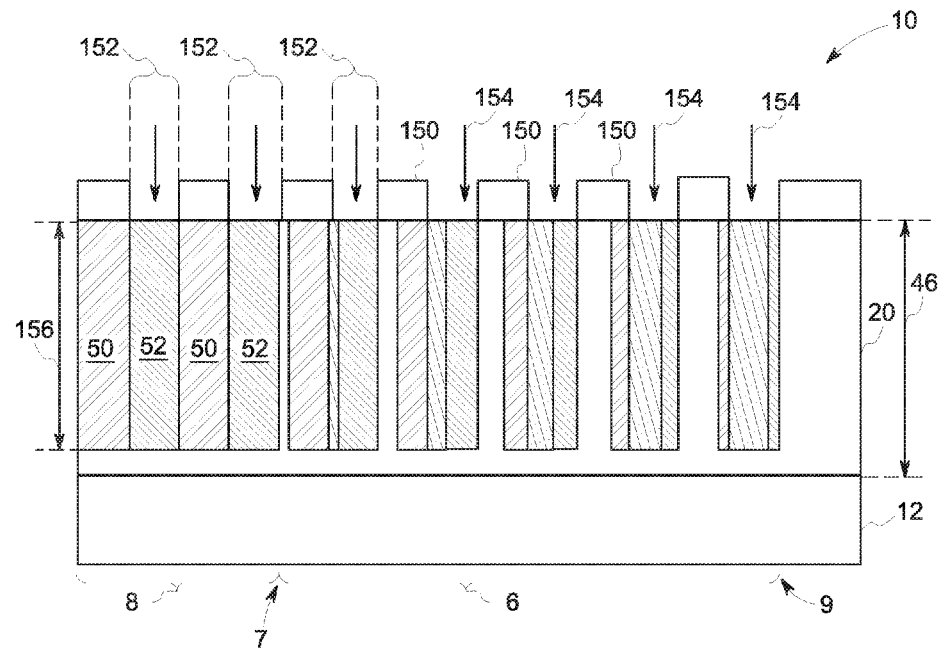

After removing the first lithographic mask 140, a second lithographic mask 150 is applied to the surface of the epi layer 20, as illustrated in FIG. 5C. In general, the same photolithographic masking materials discussed above may be used. The second mask 150 exposes a second portion 152 of the epi layer 20 and a second high-energy implantation (represented by the arrows 154) is performed to implant dopant of the second conductivity-type into both the active region 8 and the termination region 6 of the epi layer 20. Like the first implantation 144, in certain embodiments, the penetration depth 156 of the second implantation 154 may be between approximately 4 μm and approximately 12 μm. As with the first implantation 144, the second implantation 154 may not extend all the way through the thickness 46 the bottom epi layer 20 (i.e., nearest the SiC substrate 12) to reach the SiC substrate 12; however, it should be appreciated that the second implantation should extend through the entire thickness of other epi layers (e.g., epi layer 16, epi layer 18, as illustrated in FIG. 1). As mentioned, in certain embodiments, a deviation (e.g., variation) between the first implantation dose ($N_a$) and the second implantation dose ($N_b$) is generally within approximately 20% (e.g., within 15%, 10%, 5%). In certain embodiments, the ratio of the first implantation dose and the second implantation dose ($N_a/N_b$) is greater than or equal to 0.8 and less than or equal to 1.2.

Figure 5D:
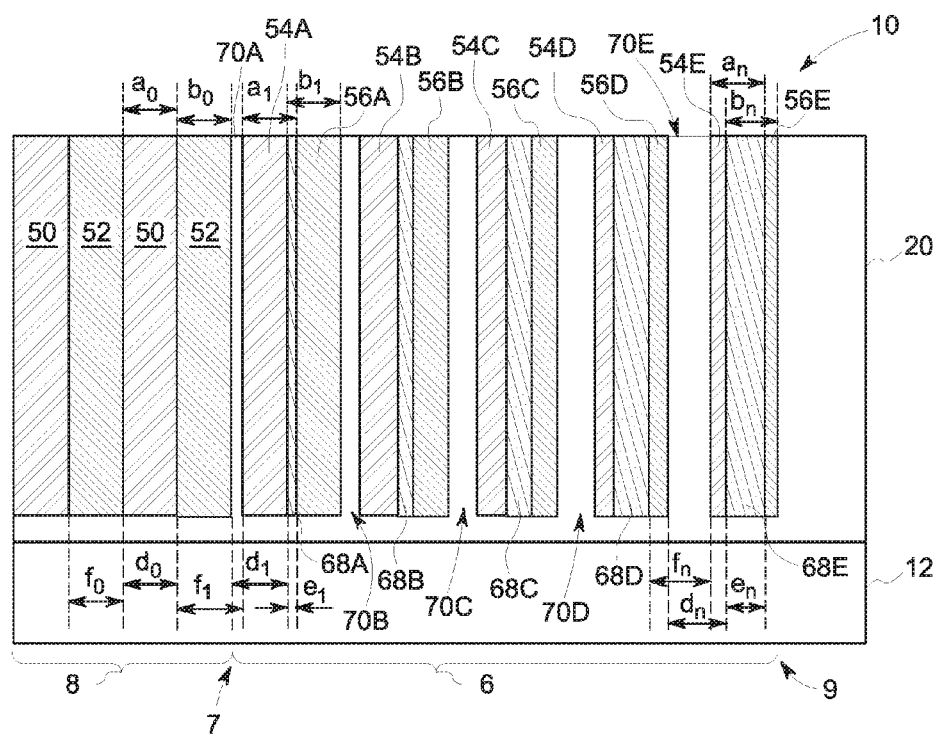

FIG. 5D illustrates the structure after removing the second lithographic mask 150. As illustrated in FIG. 5D, there is overlap (e.g., common or shared areas) between the first portion 142 of FIG. 5B (which received the first implantation 144) and the second portion 152 of FIG. 5C (which received the second implantation 154), and this overlap results in the formation of the compensated regions 68 (e.g., 68A, 68B, 68C, 68D, 68E). For the illustrated embodiment, there is substantially no intentional overlap between the first portion 142 and the second portion 152 in the active region 8, and there is increasing overlap in the termination region 6 with increasing distance from the boundary 7. As a result, the compensated regions 68 of the termination region 6 have larger widths 72 with increasing distance from the boundary 7, as illustrated in FIG. 1. Additionally, portions of the epi layer 20 that are masked during both implantation steps generally maintain the doping concentration of the epi layer 20, resulting in the formation of the epi-doped regions 70 between the vertical pillars 54 and 56. As a result, for the illustrated embodiment, there are no substantial epi-doped regions 70 between the vertical charge-balance pillars 50 and 52 in the active region 8 of the epi layer 20, while epi-doped regions 70 are disposed between the vertical pillars 54 and 56 in the termination region that have larger widths 74 with increasing distance from the boundary 7. Additionally, for the illustrated embodiment, the aforementioned overlap also reduces the width of the resulting vertical pillars 54 and 56 in the termination region 6. For example, as illustrated in FIG. 1, compared to the widths 64 or 66 of change-balance pillars 50 and 52 in the active region 8, the vertical pillars 54 and 56 of the termination region 6 have smaller widths 60 and 62, respectively, which continue to decrease with increasing distance from the boundary 7.

FIG. 5D also includes notations to facilitate the disclosure of dimensions within the illustrated epi layer 120. In particular, $a_n$ represents the width of the implants of the first conductivity-type, $b_n$ represents the width of the implants of the second conductivity-type, $e_n$ represents the overlap between the two implants, $f_n$ represents the distance between implants of the first conductivity-type, and $d_n$ represents the distance between implants of the second conductivity-type. More specifically, $a_0$ and $b_0$ represent the widths 64 and 66 of the vertical charge-balance pillars 50 and 52, respectively, in the active region 8 of the epi layer 20, as illustrated in FIG. 1. While, the widths 64 and 66 of the vertical charge-balance pillars 50 and 52 are substantially equal for the illustrated embodiment (i.e., $a_0=b_0$), in other embodiments, the widths 64 and 66 may be different (e.g., by 5%, 10%, 20% or more). Additionally, $f_0$ and $d_0$ represent the distance between the vertical pillars of the first and second conductivity-types, respectively, in active region 8 of the epi layer 20. In certain embodiments, $a_0$, $b_0$, $f_0$, and $d_0$ may each individually range between approximately 2 μm and approximately 10 μm. Additionally, in certain embodiments, the $(a_n-e_n)$ is less than or equal to $(a_{n-1}-e_{n-1})$, and $(b_n-e_n)$ is less than or equal to $(b_{n-1}-e_{n-1})$. Additionally, as illustrated, $e_0$ is zero, meaning that there is not substantial overlap between the vertical charge-balance pillars 50 and 52 in the active region 8. Furthermore, in certain embodiments, $e_n$ is less than or equal to $e_{n+1}$, such that the widths 72 (e.g., width 72A, 72B, 72C, 72D, 72E) of the compensated regions 68 (e.g., compensated regions 68A, 68B, 68C, 68D, 68E) increase with increasing distance from the boundary 7, as illustrated in FIG. 1.

In terms of doping, as mentioned, in certain embodiments, the implantation dose of the first and the second implantation steps of FIGS. 5B and 5C may be substantially similar. For example, in certain embodiments, the implantation dose of the dopant of the first conductivity-type in the first implantation step, as illustrated in FIG. 5B, is within about 20% of the implantation dose of the dopant of the second conductivity-type in the second implantation step, as illustrated in FIG. 5C. In certain embodiments, the implantation dose of the first implantation step may be substantially the same as the implantation dose of the second implantation step. As such, in certain embodiments, a ratio of the doping concentration of the vertical pillars of the first conductivity-type and the doping concentration of the vertical pillars of the second conductivity-type may be between 0.8 and 1.2. As such, in certain embodiments, a dopant concentration in the compensated regions 68 may be approximately equal the epitaxial doping of the epi layer 20 (e.g., ±20%, ±15%, ±10%, ±5%). For certain embodiments of the SiC-SJ device 10, the multiplication product of a dopant concentration and the width 64 (i.e., $a_0$) of the vertical charge-balance pillars of the first conductivity-type 50 in the active region 8 is less than approximately $2 \times 10^{-13}$ cm$^{-2}$. Similarly, for certain embodiments the SiC-SJ device 10, the multiplication product of a dopant concentration and the width 66 (i.e., $b_0$) of the vertical charge-balance pillars of the second conductivity-type 52 in the active region 8 is less than approximately $2 \times 10^{-13}$ cm$^{-2}$.

Figure 5E:
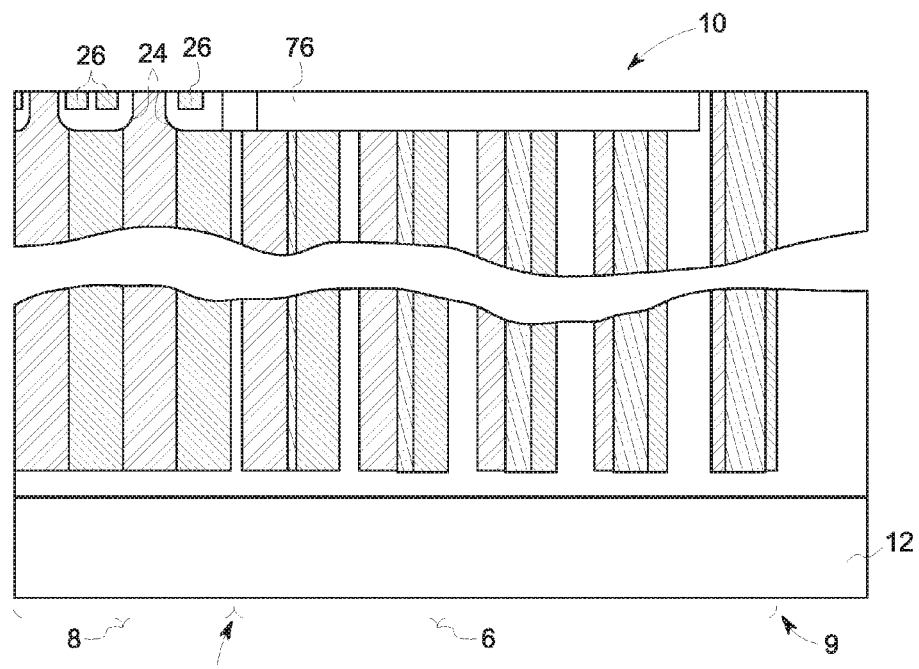

Continuing through the example fabrication, the next epi layer (e.g., epi layer 18 of FIG. 1) may be formed on top of the initial epi layer 20, and the masking and implantation steps of 5B and 5C are repeated for the new layer. It may be appreciated that these growth and implantation steps can be repeated multiple times (e.g., 2, 3, 4, 5, or more times) to form larger, multi-layered embodiments of the SiC-SJ structure 10 illustrated in FIG. 1. For example, using the disclosed technique, an embodiment of the SiC-SJ device 10 with a single buried (lower) epi layer may be rated for between 600 volts (V) and 1700 V, an embodiment of the SiC-SJ device 10 with two buried (lower) epi layers may be rated for between 1.5 kilovolts (kV) and 3 kV, an embodiment of the SiC-SJ device 10 with three buried (lower) epi layers may be rated for between 2 kV and 5 kV, and an embodiment of the SiC-SJ device 10 with four buried (lower) epi layers may be rated for between 3 kV and 10 kV. After repeating the growth and implantation steps of FIGS. 5A-D the desired number of times, the top epi layer 14 may be formed and the desired device features (e.g., well region 24, source regions 26, JTE 76) are implanted into the device layer 14 to form the SiC-SJ device 10, as illustrated in FIG. 5E.

Figure 6A:
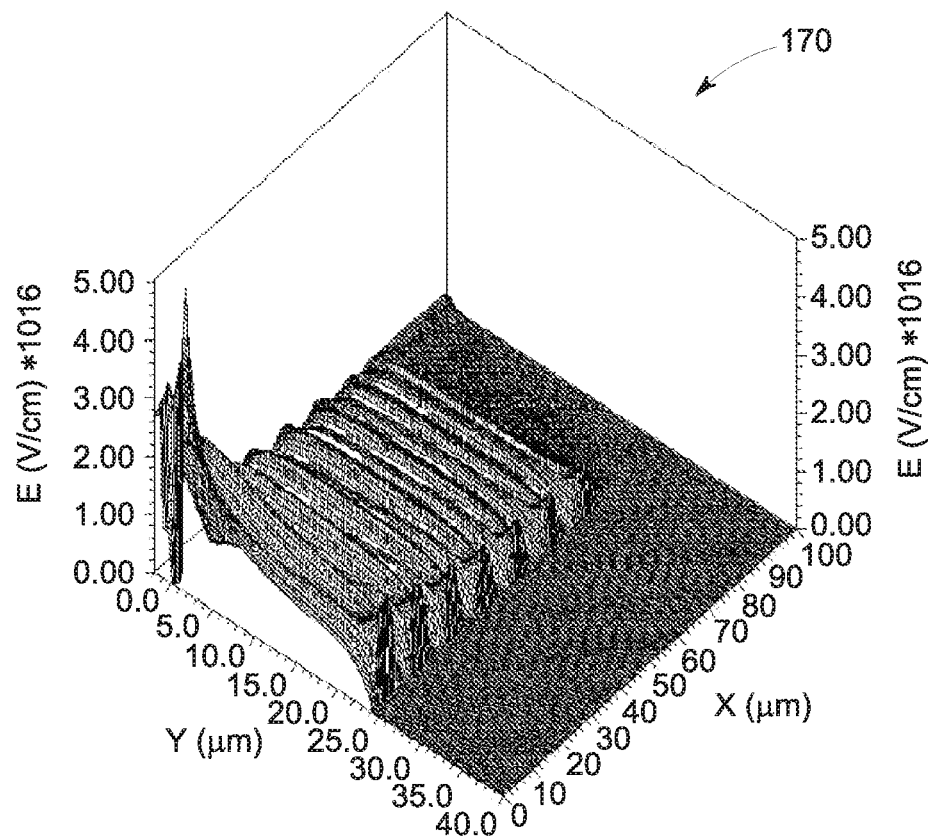
FIGS. 6A and 6B are graphs illustrating electric field distribution in the termination region of SiC-SJ device of FIG. 1 without and with a junction termination extension (JTE) in the device layer, respectively.
Figure 6B:
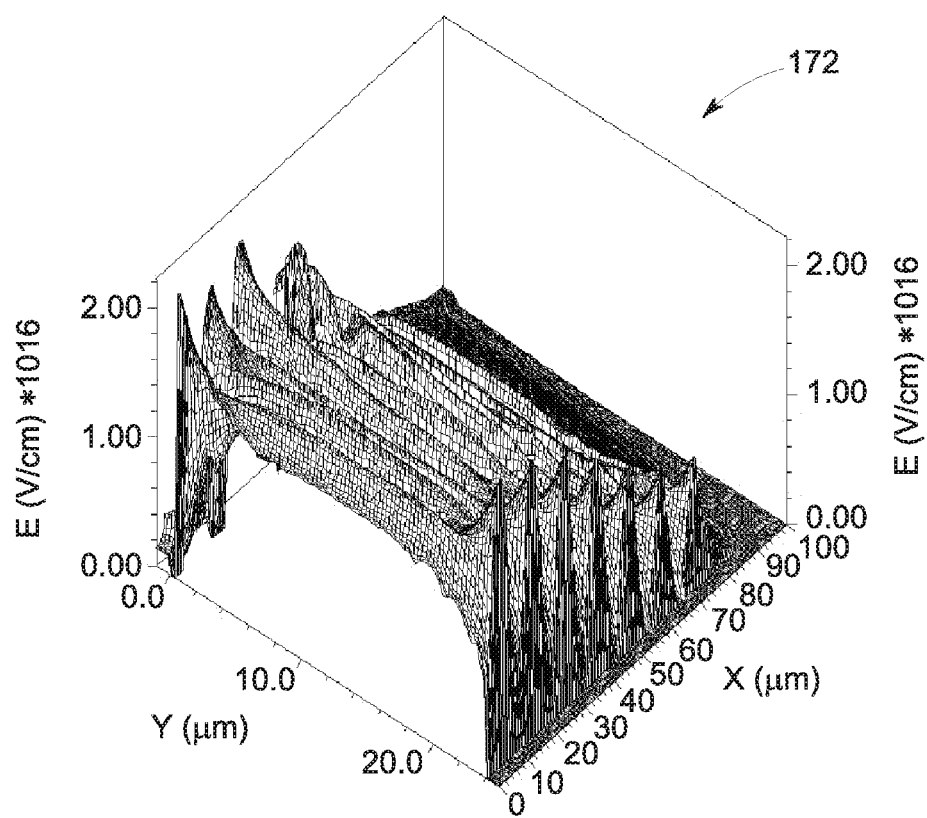

FIGS. 6A and 6B are graphs 170 and 172 illustrating models of electric field distribution in the SiC-SJ device of FIG. 1 without and with the junction termination extension (JTE) 76 in the device layer 14, respectively. In general, the electric field distribution of FIG. 6A demonstrates relatively uniformly low electric field distribution (e.g., less than approximately $2 \times 10^6$ volts per square centimeter (V/cm$^2$)) throughout much of the device, even without the JTE being present. Additionally, with the addition the JTE in the device layer 14 of the SiC-SJ device 10, a uniformly low electric field distribution (e.g., less than approximately $2 \times 10^6$ volts per square centimeter (V/cm$^2$)) is observed throughout the entire device, as illustrated in FIG. 6.

Figure 7:
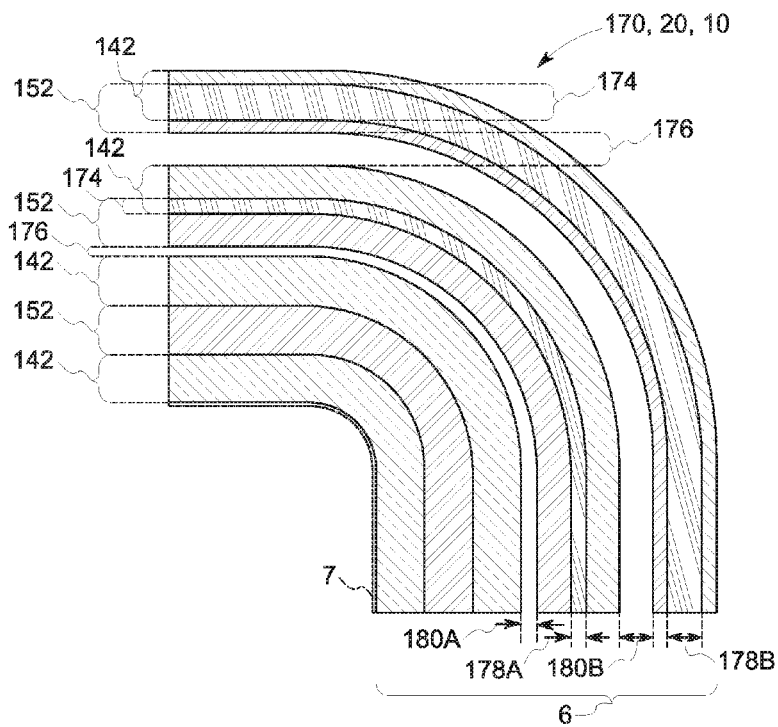
FIG. 7 is a partial top-down view a termination region of a lower (buried) epi layer indicating portions of the epi layer that are exposed to the first and second implantation steps to form continuous implanted stripes that respectively define the vertical pillars of the first and second conductivity-type in the cross-sectional view of the termination region.
Figure 8:
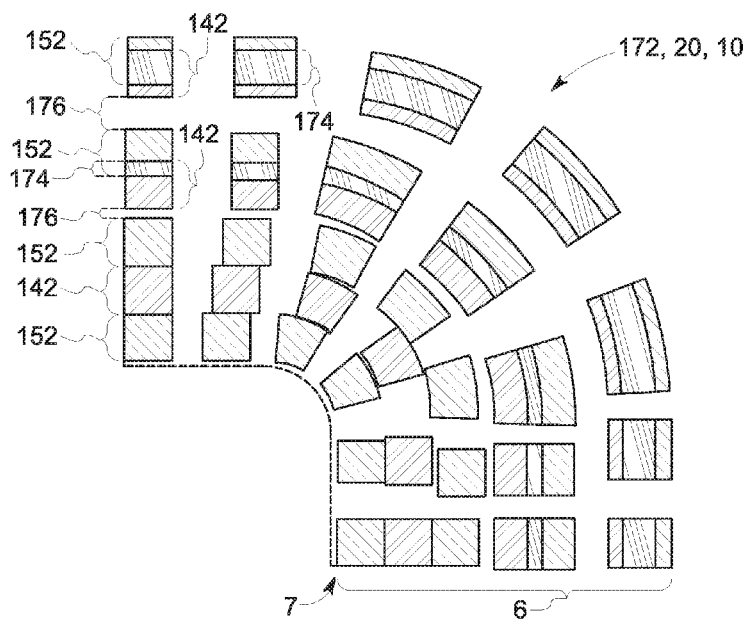
FIG. 8 is a partial top-down view a termination region of a lower (buried) epi layer indicating portions of the epi layer that are exposed to the first and second implantation steps to form discrete implanted regions that respectively define the vertical pillars of the first and second conductivity-type in the cross-sectional view of the termination region.

FIGS. 7 and 8 are partial top-down views 170 and 172 of a portion of termination region 6 of a lower (buried) epi layer (e.g., epi layer 16, 18, or 20 for the SiC-SJ device 10 illustrated in FIG. 1) indicating portions of the epi layer 20 that are exposed by the first and second masks and implanted during the first and second implantation steps, as illustrated in FIGS. 5B and 5C. Specifically, the regions 142 generally correspond to portions of the epi layer 120 that are exposed (i.e., not covered or shielded) by the first mask 140 and are implanted with the first implantation step 144 using dopants of the first conductivity-type, while shaded regions 152 generally correspond to portions of the epi layer 120 that are exposed (i.e., not covered or shielded) by the second mask 150 and are implanted with the second implantation step 154 using dopants of the second conductivity-type.

Accordingly, for FIGS. 7 and 8, the regions 174 represent regions of overlap (i.e., regions of the epi layer 120 that are exposed during both the first and the second implantation steps), which result in the formation of the compensated regions 68 illustrated in cross-sectional view of FIG. 1. The regions 176 represent regions of the epi layer 120 that are not exposed or implanted during the first or second implantation steps and generally maintain the doping concentration of the epi layer 120, which form the epi-doped regions 70 (e.g., epi-doped regions 70A, 70B) between the vertical pillars 54 and 56 in the cross-sectional view of FIG. 1. As illustrated, the widths 178 (e.g., widths 178A, 178B) of the overlap 174 between the portions 142 and 152, which corresponds to the widths 72 of the compensated regions 68 in the cross-sectional view of FIG. 1, are generally larger with increasing distance from the boundary 7. Further, the widths 180 (e.g., widths 180A, 180B) of the regions 176 of the epi layer 120 that are not exposed to the first or second implantation processes, corresponding to the epi-doped regions 68 between the vertical pillars 54 and 56 in the cross-sectional view of FIG. 1, are generally larger with increasing distance from the boundary 7.

More specifically, FIG. 7 represents an epi layer 20 of an embodiment of a SiC-SJ device 10 in which the vertical pillars 54 and 56 and the compensated regions 68, as illustrated in the cross-sectional view of FIG. 1, are implemented using continuous implanted stripes in the top-down view of the epi layer 120 of FIG. 7. In contrast, FIG. 8 represents an epi layer 120 of an embodiment of the SiC-SJ device 10 in which the vertical pillars 54 and 56 and the compensated regions 68, as illustrated in the cross-sectional view of FIG. 1, are implemented as discrete implanted regions of arbitrary shape in the top-down view of the epi layer 120 of FIG. 8. As illustrated in FIG. 8, in certain embodiments, there may be some intentional misalignments between these implanted regions resulting in pillars and compensated regions size of a desired size, enabling suitable edge termination. Additionally, it may be appreciated that, in other embodiments, these discrete regions may have other shapes, including geometric (e.g., square, circular, triangular, rectangular, etc.) shapes or irregular shapes, in accordance with the present disclosure.

Technical effects of the invention include edge termination designs for SJ devices that provide a blocking voltage that is close to device entitlement, that do not substantially increase on-state resistance, and that can be fabricated using a minimal number of process steps. The disclosed edge termination technique enables the simultaneous implantation of the active and termination regions of each epi layer of the SJ structure using only two high-energy implantation steps per epi layer, limiting the number of process steps. Additionally, the disclosed termination design enables the manufacture of SJ devices in which the vertical change-balance pillars of the active region can be defined using a minimum feature width of the process/technology, and the vertical pillars in the termination region may have widths that are less than this minimum feature width, resulting in a smaller device pitch size and higher device cell density.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor super-junction (SJ) device, comprising:
   a substrate layer having a first conductivity-type;
   one or more epitaxial (epi) layers disposed on the substrate layer and including a termination region disposed adjacent to an active region, wherein the active region comprises vertical charge-balance pillars of the first conductivity-type, each having a first width, and vertical charge-balance pillars of a second conductivity-type, each having a second width, and wherein the termination region comprises:
      a plurality of vertical pillars of the first and second conductivity-type, wherein, moving outward from the active region, a respective width of each successive vertical pillar of the plurality of vertical pillars is the same or smaller; and
      a plurality of compensated regions having a low doping concentration disposed directly between a first side of each vertical pillar of the first conductivity-type and a first side of each vertical pillar of the second conductivity-type, wherein, moving outward from the active region, a respective width of each successive compensated region of the plurality of compensated regions is the same or greater.

2. The semiconductor SJ device of claim 1, wherein a plurality of epi-doped regions separate a second side of each vertical pillar of the first conductivity-type and a second side of each vertical pillar of the second conductivity-type in the termination region, and wherein, moving outward from the active region, a respective width of each of the plurality of epi-doped regions is greater.

3. The semiconductor SJ device of claim 1, wherein the first and second widths are substantially equal and are between approximately 2 micrometers ($\mu$m) and 10 $\mu$m.

4. The semiconductor SJ device of claim 1, wherein each of the one or more epi layers has a thickness between approximately 4 $\mu$m and 12 $\mu$m.

5. The semiconductor SJ device of claim 1, wherein a doping concentration of the plurality of vertical charge-balance pillars of the first conductivity-type in the active region and the plurality of vertical pillars of the first conductivity-type in the termination region is five times (5×) higher than an epi doping concentration of the one or more epi layers.

6. The semiconductor SJ device of claim 1, wherein a width of each of the vertical charge-balance pillars of the first conductivity-type in the active region is between approximately 2 $\mu$m and 10 $\mu$m.

7. The semiconductor SJ device of claim 1, wherein a width of each of the vertical charge-balance pillars of the second conductivity-type in the active region is between approximately 2 $\mu$m and 10 $\mu$m.

8. The semiconductor SJ device of claim 1, a ratio of a doping concentration of the vertical charge-balance pillars of the first conductivity-type in the active region and the vertical pillars of the first conductivity-type in the termination region to a doping concentration of the vertical charge-balance pillars of the second conductivity-type in the active region and the vertical pillars of the second conductivity-type in the termination region is greater than or equal to 0.8 and less than or equal to 1.2.

9. The semiconductor SJ device of claim 1, wherein the one or more epi layers have the first conductivity-type, and wherein a doping concentration in the plurality of compensated regions is equivalent to an epi doping concentration of the one or more epi layers plus a doping concentration in the vertical charge-balance pillars of the first conductivity-type minus a doping concentration in the vertical charge-balance pillars of the second conductivity-type.

10. The semiconductor SJ device of claim 1, wherein the one or more epi layers have the second conductivity-type, wherein a doping concentration in the plurality of compensated regions is equivalent to an epi doping concentration of the one or more epi layers minus a doping concentration in the vertical charge-balance pillars of the first conductivity-type plus a doping concentration in the vertical charge-balance pillars of the second conductivity-type.

11. The semiconductor SJ device of claim 1, wherein a multiplication product of a dopant concentration of the vertical charge-balance pillars of the first conductivity-type and the first width is less than or equal to approximately $2 \times 10^{-13}$ cm$^{-2}$, and wherein a multiplication product of a dopant concentration of the vertical charge-balance pillars of the second conductivity-type and the second width is less than or equal to approximately $2 \times 10^{-13}$ cm$^{-2}$.

12. The semiconductor SJ device of claim 1, wherein the one or more epi layers are disposed on the substrate layer and an epi device layer is disposed on the one or more epi layers, wherein the device layer comprises a graded or a multizone junction termination extension (JTE) that comprises a plurality of implanted blocks or a continuous layer of the second conductivity-type.

13. The semiconductor SJ device of claim 1, wherein the device is a super-junction metal-oxide-semiconductor field-effect transistors (SJ-MOSFET), super junction junction field effect transistors (SJ-JFETs), super junction bipolar junction transistors (SJ-BJTs), or super-junction diode.

14. The semiconductor SJ device of claim 1, wherein a peak electric field in the termination region of the device during operation at maximum rated voltage is less than approximately $3 \times 10^6$ volts per square centimeter (V/cm$^2$).

15. The semiconductor SJ device of claim 1, wherein the one or more epi layers comprise a single epi layer and the device is rated for between 600 volts (V) and 1700 V, or wherein the one or more epi layers comprise two epi layers and the device is rated for between 1.5 kilovolts (kV) and 3 kV, or wherein the one or more epi layers comprise three epi layers and the device is rated for between 2 kV and 5 kV, or wherein the one or more epi layers comprise four epi layers and the device is rated for between 3 kV and 10 kV.

16. The semiconductor SJ device of claim 1, wherein the SJ semiconductor device is a wide bandgap semiconductor device comprising: silicon carbide (SiC), gallium nitride (GaN), aluminum nitride (AlN), or boron nitride (BN).

* * * * *